Jan. 16, 1968 S. B. RICE, JR 3,364,301

MANUFACTURE OF CERAMIC CIRCUIT PACKAGE

Filed Oct. 29, 1965

Stanley B. Rice Jr.,
Inventor.

Koenig, Senniger, Powers and Leavitt,
Attorneys.

3,364,301

MANUFACTURE OF CERAMIC CIRCUIT PACKAGE

Stanley B. Rice, Jr., Garland, Tex., assignor to Texas Instruments Incorporated, Dallas, Tex., a corporation of Delaware Filed Oct. 29, 1965, Ser. No. 505,680
2 Claims. (Cl. 174—68.5)

ABSTRACT OF THE DISCLOSURE

Disclosed is a ceramic circuit package comprising framework leads anchored directly in grooves on a ceramic bar by a glass glaze, and circuitry on the glass glaze connected to the leads.

This invention relates to the manufacture of a ceramic circuit package, and more particularly to the attachment of leads to a ceramic bar used in forming an integrated semiconductor network or so-called SCN microminiature package.

Among the several objects of the invention may be noted the provision of a method of manufacturing certain components of an integrated ceramic circuit package in fewer steps and less time than previously required; the provision of a method of manufacturing ceramic circuit package parts wherein intricate, time-consuming steps previously required for metallizing portions of a ceramic substrate and welding a lead to the metallized area have been eliminated; the provision of an improved method for attaching leads to a ceramic member; and the provision of an integrated circuit package manufactured according to the method of the invention. Other objects and features will be in part apparent and in part pointed out hereinafter.

The invention accordingly comprises the methods, constructions and products hereinafter described, the scope of the invention being indicated in the following claims.

Figure 1:
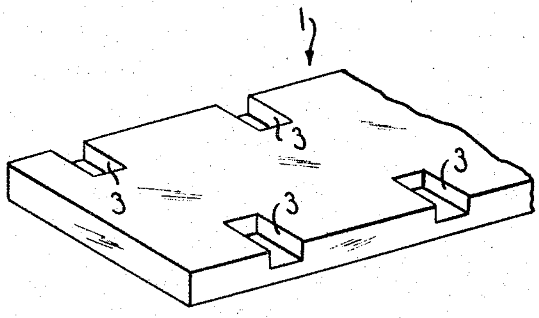
Figures 2, 3:
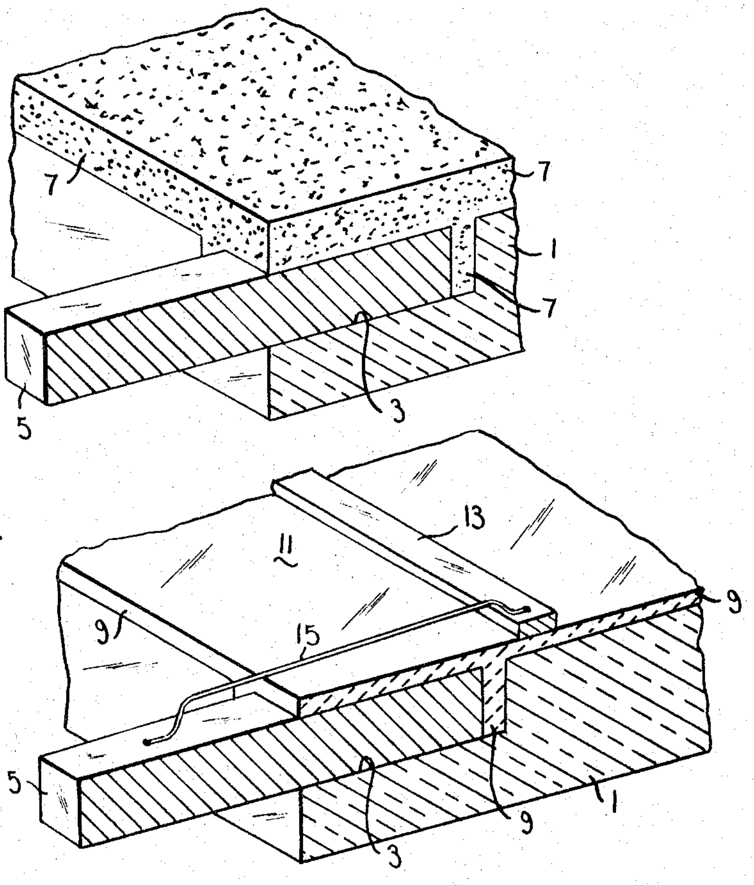

In the accompanying drawings, in which one of various possible embodiments of the invention is illustrated:

FIGURE 1 is a fragmentary perspective view of a ceramic substrate used for manufacturing a bar of a circuit package; and FIGURES 2 and 3 are enlarged fragmentary perspective views illustrating changes that occur during manufacture of a circuit package employing the FIGURE 1 substrate or bar.

Corresponding reference characters indicate corresponding parts throughout the several views of the drawings. For clarity of illustration, the sizes, thicknesses, etc., of parts are exaggerated; hence the drawings are not to scale.

Manufacture of a microminiature ceramic circuit package by previous methods required applying metallizing material to selected areas of a ceramic substrate or bar, reacting the metallizing material with the ceramic and removing excess oxides resulting from the reaction. The reacted area was then plated (usually for several hours) and the plating annealed. A glass glaze was then applied to the ceramic and fired. Circuitry was formed on the glazed surface and conductors connected between the circuitry and the metallized areas. Framework leads were also welded to the metallized areas. The steps required for metallizing, plating and welding of framework leads to the metallizing areas have been entirely eliminated by the method of this invention. The invention also results in an improved product.

Briefly, manufacture of a ceramic circuit package according to this invention comprises placing conductive leads directly on a ceramic bar, covering the leads and adjacent portions of the ceramic with a glass or glazing frit, and firing the frit. This anchors the leads on the ceramic bar. Then circuitry is formed on the resulting glazed surface. Thereafter accessory leads are connected between the circuitry and to the conductive leads.

Referring now to the drawings, there is shown at numeral 1 a rectangular ceramic substrate in the form of a bar which has a plurality of spaced, shallow marginal grooves 3 in one of its surfaces. The ceramic may be forsterite ($2MgO \cdot SiO_2$), steatite ($MgO \cdot SiO_2$), or other suitable types. Usually the bar is of microminiature dimensions difficult to work with, thus calling for procedures which are as simple as possible.

Each of the grooves 3 receives a Kovar framework lead 5 (FIGURES 2 and 3) which projects beyond the edge of the ceramic 1. According to prior processes, a bank of leads 5 extending from a supporting framework for the same were placed on and attached to metallized surfaces in the grooves 3 and by intricate steps bonded thereto.

According to the present invention, the metallized surfaces are eliminated and the framework leads 5 are placed directly in grooves 3 in the ceramic 1. Next the surface of ceramic 1, which is to carry the circuitry, and the ends of framework leads 5 in grooves 3 are covered with a slurry of a glass or like frit. Preferably this is accomplished by use of a mixture of frit powder and a carrier or vehicle such as the commercially available Du Pont H–220 vehicle. This floods into each groove 3 around the lead therein. This H–220 material is an organic vehicle or carrier and its purpose is to suspend the frit and spread it on the ceramic and the leads. Other vehicles that might be used for this purpose are amyl acetate, dextrim, gum arabic, gum tragacanth and other organic substances. The Du Pont product is preferred, since it leaves virtually no residue after firing. The frit powder is composed of finely divided glass or other material used to make glass or the like. A high lead glass such as Corning 7570 glass is satisfactory for the frit.

The term "frit" as used herein includes a finely divided material of which glasses or glazes are made after having been calcined or partly fused in a furnace but before vitrification.

After glass frit 7 has been applied to the ceramic, leads 5 and frit 7 are placed in a furnace to fire the frit. Using the above-mentioned 7570 glass frit and Du Pont H–220 vehicle, the frit is, for example, fired at about 700° C. in air for about 20 minutes. The ceramic is then removed from the furnace and after cooling there occurs a layer or glaze of glass designated 9. This extends across the surface of the ceramic 1 and over and around a portion of each lead 5 in its groove 3. Thus layer 9 secures or anchors the leads 5 to the ceramic. The upper surface 11 of the glass or glaze 9 preferably has a smoothness of about 0.2 micron, as fired.

Circuitry is evaporated on the smooth glazed surface 11 in the conventional manner. A portion of such circuitry is illustrated at numeral 13 in FIGURE 3. Such portion 13 may be connected through a conductor 15 (shown diagrammatically) with, for example, a secured Kovar lead 5 by convenient so-called ball bonding. It will be understood that each lead 5 extending from a groove 3 has an appropriate connection with a desired part of the circuitry. The resulting ceramic circuit package may be encapsulated in the usual manner to form a complete microminiaturized package.

By securing leads 5 directly to the ceramic 1 by the vitrified frit in the manner described, the steps required by previous processes are eliminated, including metallizing the ceramic, nickel-plating the metallized area, annealing the plated surface, and then welding the leads 5 to the annealed nickel surface. This very materially reduces the time required for processing the ceramic package, particularly by those previous processes which required a thin 3 to 4 mils thickness of plated nickel and where the plating was by an electroless process at a rate of about 0.5 mil per hour. The process of this invention also eliminates the need for all of the plating and metallizing materials previously required. The result is an economical and simple process which is substantially less time-consuming and requires less material than previous processes.

In view of the above, it will be seen that the several objects of the invention are achieved and other advantageous results attained.

As various changes could be made in the above methods, constructions, and products without departing from the scope of the invention, it is intended that all matter contained in the above description or shown in the accompanying drawings shall be interpreted as illustrative and not in a limiting sense.

What is claimed is:

1. A ceramic package comprising a ceramic substrate, a plurality of framework leads directly in contact with the substrate, a glass glaze on a surface of the substrate and portions of the leads, the glass glaze securing the leads to the substrate and the package being free of other means for securing the leads to the substrate, and circuitry on the glaze connected to framework leads.

2. A ceramic package comprising a ceramic substrate, a plurality of grooves in the substrate, a plurality of framework leads, an end portion of each lead being positioned in a groove in the substrate directly in contact with the substrate, a glass glaze over the leads and the adjacent portions of the substrate, the glaze holding the leads onto the substrate, circuitry on the glass glaze, and accessory leads connecting portions of the circuitry to the framework leads.

References Cited

UNITED STATES PATENTS 3,271,634 9/1966 Heaton.

DARRELL L. CLAY, *Primary Examiner.*